United States Patent
Lim

(10) Patent No.: US 9,472,297 B2
(45) Date of Patent: Oct. 18, 2016

(54) SEMICONDUCTOR MEMORY DEVICE

(71) Applicant: SK hynix Inc., Gyeonggi-do (KR)

(72) Inventor: Sang Oh Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/724,543

(22) Filed: May 28, 2015

(65) Prior Publication Data

US 2016/0180947 A1 Jun. 23, 2016

(30) Foreign Application Priority Data

Dec. 19, 2014 (KR) .................. 10-2014-0184575

(51) Int. Cl.
| | |
|---|---|
| G11C 16/04 | (2006.01) |
| G11C 16/28 | (2006.01) |
| G11C 16/26 | (2006.01) |
| G11C 29/02 | (2006.01) |
| G11C 11/16 | (2006.01) |
| G11C 29/04 | (2006.01) |
| G11C 29/00 | (2006.01) |

(52) U.S. Cl.
CPC .......... *G11C 16/28* (2013.01); *G11C 11/1673* (2013.01); *G11C 16/26* (2013.01); *G11C 29/026* (2013.01); *G11C 29/04* (2013.01); *G11C 29/785* (2013.01)

(58) Field of Classification Search
CPC . G11C 16/26; G11C 11/1673; G11C 29/026; G11C 29/04; G11C 29/785
USPC ..................................... 365/185.12, 185.09
See application file for complete search history.

(56) References Cited

U.S. PATENT DOCUMENTS

| | | | |
|---|---|---|---|
| 2013/0051145 A1* | 2/2013 | Ahn .................... | G11C 16/0483 365/185.11 |
| 2013/0223170 A1* | 8/2013 | Kajigaya ................ | G11C 29/04 365/200 |
| 2013/0336060 A1* | 12/2013 | Arakawa ................ | G11C 16/06 365/185.09 |
| 2015/0121174 A1* | 4/2015 | Nakagawa .......... | G06F 11/1048 714/773 |

FOREIGN PATENT DOCUMENTS

| | | |
|---|---|---|
| KR | 1020130090575 | 8/2013 |
| KR | 1020140011147 | 1/2014 |

* cited by examiner

*Primary Examiner* — Toan Le
(74) *Attorney, Agent, or Firm* — IP & T Group LLP

(57) ABSTRACT

A semiconductor memory device includes a memory cell part including a main memory unit and a redundancy memory unit, a page buffer circuit including a plurality of page buffer groups and reading data stored in the memory cell part, and a sensing circuit including a plurality of sense amplifiers corresponding to the plurality of page buffer groups, respectively, and suitable for sensing the read data, wherein the plurality of sense amplifiers perform data sensing operations in parallel in order to sense the read data.

20 Claims, 8 Drawing Sheets

SEMICONDUCTOR MEMORY DEVICE

CROSS-REFERENCE TO RELATED APPLICATION

The present application claims priority to Korean patent application number 10-2014-0184575, filed on Dec. 19, 2014, the entire disclosure of which is herein incorporated by reference in its entirety.

BACKGROUND

1. Technical Field

Various embodiments relate generally to an electronic device and, more particularly, to a semiconductor memory device.

2. Related Art

Semiconductor memory devices are typically categorized into volatile memory devices and non-volatile memory devices.

Non-volatile memory devices operate at relatively low write and read speeds, but they may retain stored data in the absence of a power supply. Therefore, non-volatile memory devices may be used to store data which needs to be retained regardless of power on/off conditions. Examples of the non-volatile memory devices include read only memory (ROM), mask ROM (MROM), programmable ROM (PROM), erasable programmable ROM (EPROM), electrically erasable programmable ROM (EEPROM), flash memory, phase-change random access memory (PRAM), magnetoresistive RAM (MRAM), resistive RAM (RRAM) and ferroelectric RAM (FRAM). Flash memories are categorized into NOR and NAND types.

Flash memories enjoy the advantages of both RAM and ROM. For example, flash memories may be freely programmed and erased similar to RAM. Similar to ROM, flash memories may retain stored data even when they are not powered. Flash memories have been widely used as the storage media of portable electronic devices such as mobile phones, digital cameras, personal digital assistants (PDAs), and MP3 players.

BRIEF SUMMARY

An embodiment is directed to a semiconductor memory device capable of improving the stability of a data output operation thereof.

A semiconductor memory device according to an embodiment may include a main sense amplifier circuit suitable for sensing first potentials of main data lines coupled to a main cell region and outputting the first potentials to a global data line in response to first strobe signals having a first period, and a redundancy sense amplifier circuit suitable for sensing a second potential of a redundancy data line coupled to a redundancy cell region and outputting the second potential to the global data line in response to second strobe signals having a second period, wherein the second period is shorter than the first period.

A semiconductor memory device according to an embodiment may include a memory block including a main memory area and a redundancy memory area, main data lines and a redundancy data line corresponding to the main memory area and the redundancy memory area, respectively, a strobe signal generation unit suitable for outputting first strobe signals having a first period and a second strobe signal having a second period, and a sense amplifier circuit suitable for sensing potential levels of the main data lines and the redundancy data line and outputting sensed read data to a global data line in response to the first and second strobe signals.

A semiconductor memory device according to an embodiment may include a memory cell part including a main memory unit and a redundancy memory unit, a page buffer circuit including a plurality of page buffer groups and suitable for reading data stored in the memory cell part to temporarily store read data, and a sensing circuit including a plurality of sense amplifiers corresponding to the plurality of page buffer groups, respectively, and sensing the read data, wherein the plurality of sense amplifiers perform data sensing operations in parallel in order to sense the read data.

DETAILED DESCRIPTION

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scope of its claims.

Furthermore, 'connected/coupled' represents that one component is directly coupled to another component or coupled to another component through an Intervening component therebetween. A singular form may include a plural form as long as it is not specifically mentioned. Furthermore, 'include/comprise' or 'including/comprising' used in the specification represents that one or more components, steps, operations, and elements exist or are to be added.

Figure 1:
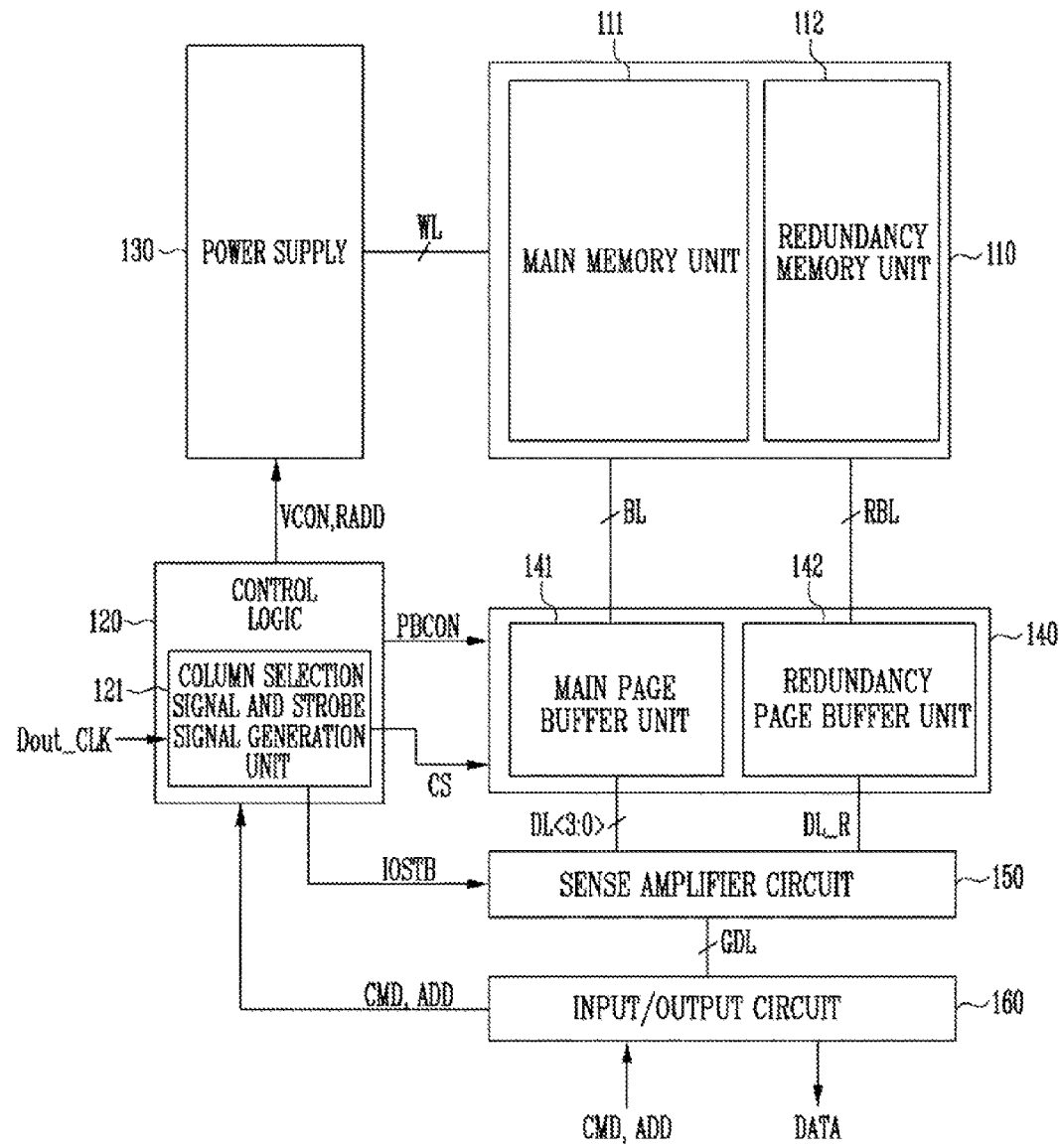
FIG. 1 is a block diagram illustrating a semiconductor memory device according to an embodiment.

FIG. 1 is a block diagram illustrating a semiconductor device according to an embodiment.

Referring to FIG. 1, a semiconductor memory device according to an embodiment may include a memory cell part 110 including a plurality of memory cells, and a peripheral circuit. The peripheral circuit may perform a read operation on selected memory cells in the memory cell part 110 and output the read data. The peripheral circuit may include a control logic 120, a voltage supply 130, a page buffer circuit 140, a sense amplifier circuit 150, and an input/output circuit 160.

The memory cell part 110 may include a main memory unit 111 and a redundancy memory unit 112. The main memory unit 111 may be coupled to the page buffer circuit 140 through bit lines BL. The redundancy memory unit 112 may be coupled to the page buffer circuit 140 through redundancy bit lines RBL.

The control logic 120 may output a voltage control signal VCON and a page buffer control signal PBCON in response to a command signal CMD inputted from an external device through the input/output circuit 160. The voltage control signal VCON is outputted to generate a voltage necessary to perform a read operation, and the page buffer control signal PBCON is outputted to control a plurality of page buffers included in the page buffer circuit 140. In addition, the control logic 120 may generate a column selection signal CS to output data read and temporarily stored by the page buffer circuit 140 during a read operation to an external device, and a strobe signal IOSTB to control a data sensing operation of the sense amplifier circuit 150. To generate the column selection signal CS and the strobe signal IOSTB, the control logic 120 may include a column selection signal and strobe signal generation unit 121. The column selection signal and strobe signal generation unit 121 may generate the column selection signal CS and the strobe signal IOSTB synchronized to a data output clock Dout_CLK which is activated during a data output operation. The column selection signal and strobe signal generation unit 121 may be disposed inside or outside the control logic 120.

In addition, the control logic 120 may output a row address signal RADD in response to an address signal ADD inputted from an external device through the input/output circuit 160.

The voltage supply 130 may generate operating voltages necessary for a read operation on the memory cells in response to the voltage control signal VCON of the control logic 120 and provide the operating voltages to the memory cell part 110. The voltage supply 130 may include a voltage generator and a row decoder (now shown).

The voltage generator may generate operating voltages necessary for a read operation of the memory cells in response to the voltage control signal VCON from the control logic 120. For example, the voltage generator may generate a read voltage to be applied to selected memory cells and a pass voltage to be applied to unselected memory cells, so as to perform the read operation.

The row decoder may apply the operating voltages generated by the voltage generator to the selected memory cells and the unselected memory cells in response to the row address signal RADD from the control logic 120.

The page buffer circuit 140 may include a main page buffer unit 141 coupled to the main memory unit 111 of the memory cell part 110 through the bit lines BL, and a redundancy page buffer unit 142 coupled to the redundancy memory unit 112 of the memory cell part 110 through the redundancy bit lines RBL.

The main page buffer unit 141 may include a plurality of page buffers. The plurality of page buffers may be divided into a plurality of groups. The redundancy page buffer unit 142 may include a plurality of redundancy page buffers. The redundancy page buffers may be combined into one group or divided into at least one group.

The main page buffer unit 141 and the redundancy page buffer unit 142 may read data from corresponding memory cells and temporarily store the read data during a read operation in response to the page buffer control signal PBCON. In addition, the main page buffer unit 141 and the redundancy page buffer unit 142 may transfer the temporarily stored read data to main data lines DL<3:0> and a redundancy data line DL_R in response to the column selection signal CS.

The main memory unit 111 and the main page buffer unit 141 may be defined as a main memory area, and the redundancy memory unit 112 and the redundancy page buffer unit 142 may be defined as a redundancy memory area. In addition, the main memory area and the redundancy memory area may be defined as a single memory block.

The sense amplifier circuit 150 may include a plurality of sense amplifiers. The plurality of sense amplifiers may sense the read data by sensing potential levels of the main data lines DL<3:0> and the redundancy data line DL_R in response to the strobe signal IOSTB, and output the sensed read data to a global data line GDL. The configuration of each of the sense amplifiers is described below in detail.

The input/output circuit 160 may output the read data transferred by the sense amplifier circuit 150 to an external device during the data output operation. In addition, the input/output circuit 160 may receive the command signal CMD and the address signal ADD from an external device and output the command signal CMD and the address signal ADD to the control logic 120 during the data output operation.

Figure 2:
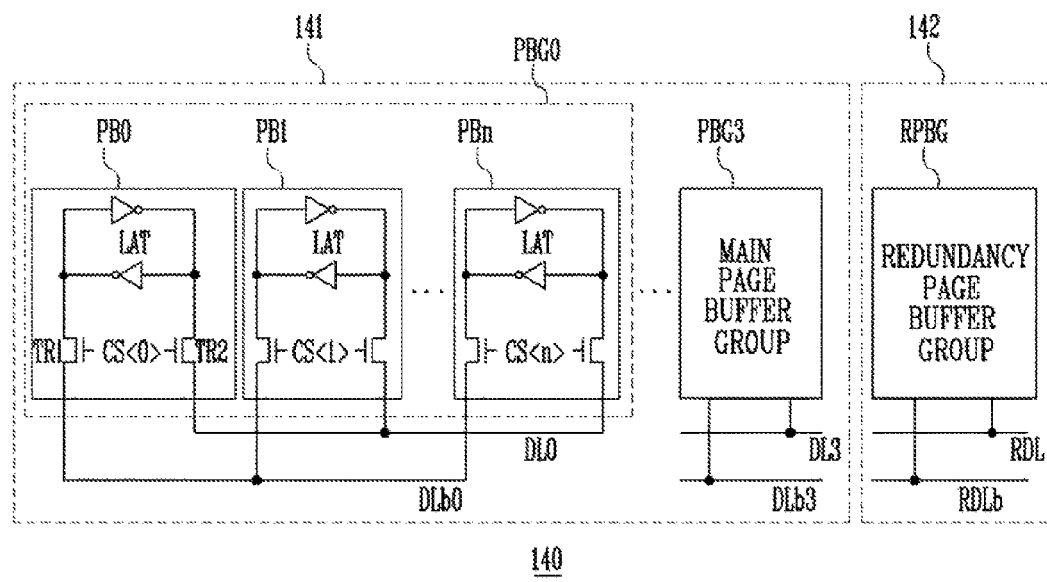
FIG. 2 is a block diagram illustrating a page buffer circuit shown in FIG. 1.

FIG. 2 is a block diagram illustrating the page buffer circuit 140 shown in FIG. 1.

Referring to FIG. 2, the page buffer circuit 140 may include the main page buffer unit 141 and the redundancy page buffer unit 142.

The main page buffer unit 141 may include a plurality of main page buffer groups PBG0 to PBG3. Each of the main page buffer groups PBG0 to PBG3 may include a plurality of page buffers PB0 to PBn. The page buffers PB0 to PBn included in one of the main page buffer groups (e.g., PBG0) may share a single data line pair (DL0 and DLb0).

Since the page buffers PB0 to PBn have substantially similar structures, only the page buffer PB0 will be described as an example.

The page buffer PB0 may include a latch LAT and transistors TR1 and TR2. The latch LAT may sense data programmed into a corresponding memory cell. The transistors TR1 and TR2 may be coupled between the latch LAT and the data line pair (DL0 and DLb0) and transfer the data stored in the latch LAT to the data line pair (DL0 and DLb0) in response to a column selection signal CS<0>.

Figure 3:
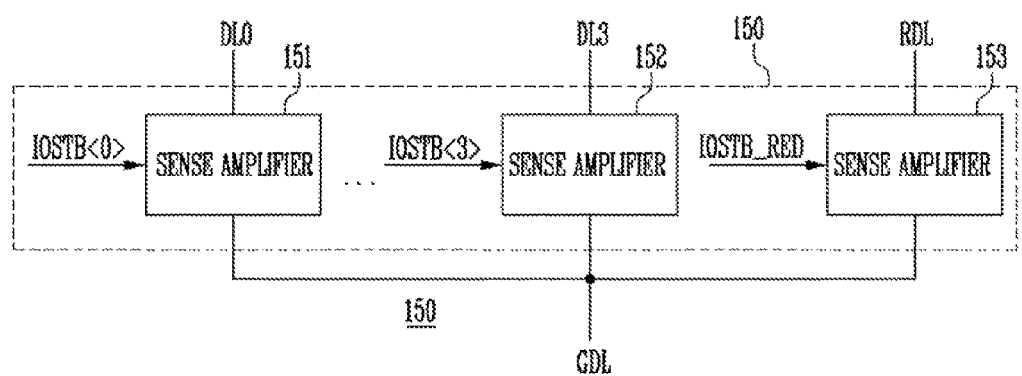
FIG. 3 is a block diagram illustrating a sense amplifier circuit shown in FIG. 1.

FIG. 3 is a block diagram illustrating the sense amplifier circuit 150 shown in FIG. 1.

Referring to FIG. 3, the sense amplifier circuit 150 may include a plurality of sense amplifiers 151 to 153.

The sense amplifiers 151 to 153 may be coupled between the global data line GDL, and the main and redundancy data lines DL0 to DL3 and RDL. Each of the sense amplifiers 151 to 153 may sense the read data by sensing a potential of a corresponding one of the main data lines DL0 to DL3 and the redundancy data line RDL in response to one of the strobe signals IOSTB<3:0> and IOSTB_RED, and transfer the sensed read data to the global data line GDL.

Since sensing operations of the sense amplifiers 151 to 153 are performed in parallel, sufficient time for sensing a potential of the data line may be ensured to stabilize the data sensing operation. For example, the strobe signals IOSTB<3:0> may toggle in a sequential manner, and the plurality of sense amplifiers 151 and 152 may sequentially perform sensing operations. Eventually, the last sense amplifier 152 may perform a sensing operation, and the first sense amplifier 151 may start to perform a sensing operation again in response to the strobe signal IOSTB<0>. Therefore, each of the plurality of sense amplifiers 151 and 152 may perform a stabilized sensing operation since a sufficient interval is guaranteed between one sensing operation and the next sensing operation.

The sense amplifier 153 may be activated during a redundancy operation, sense redundancy data by sensing the potential of a redundancy data line RDL, and transfer the sensed redundancy data to the global data line GDL. The sense amplifier 153 may perform a sensing operation in response to the strobe signal IOSTB_RED. The strobe signal IOSTB_RED may have a shorter period than the strobe signals IOSTB<3:0> so that the sense amplifier 153 may read and output at least one redundancy data to the global data line GDL during a redundancy operation. The strobe signal IOSTB_RED may have 1/n of the period of each of the strobe signals IOSTB<3:0>, where n is the number of normal page buffer groups. Thus, the redundancy operation may be performed on every normal page buffer group.

According to an embodiment, in the drawings, four main page buffer groups, four main data lines and four sense amplifiers corresponding thereto are illustrated. However, the present invention is not limited thereto. Two or more main page buffer groups, two or more data lines, and two or more sense amplifiers corresponding thereto may be included.

Figure 4:
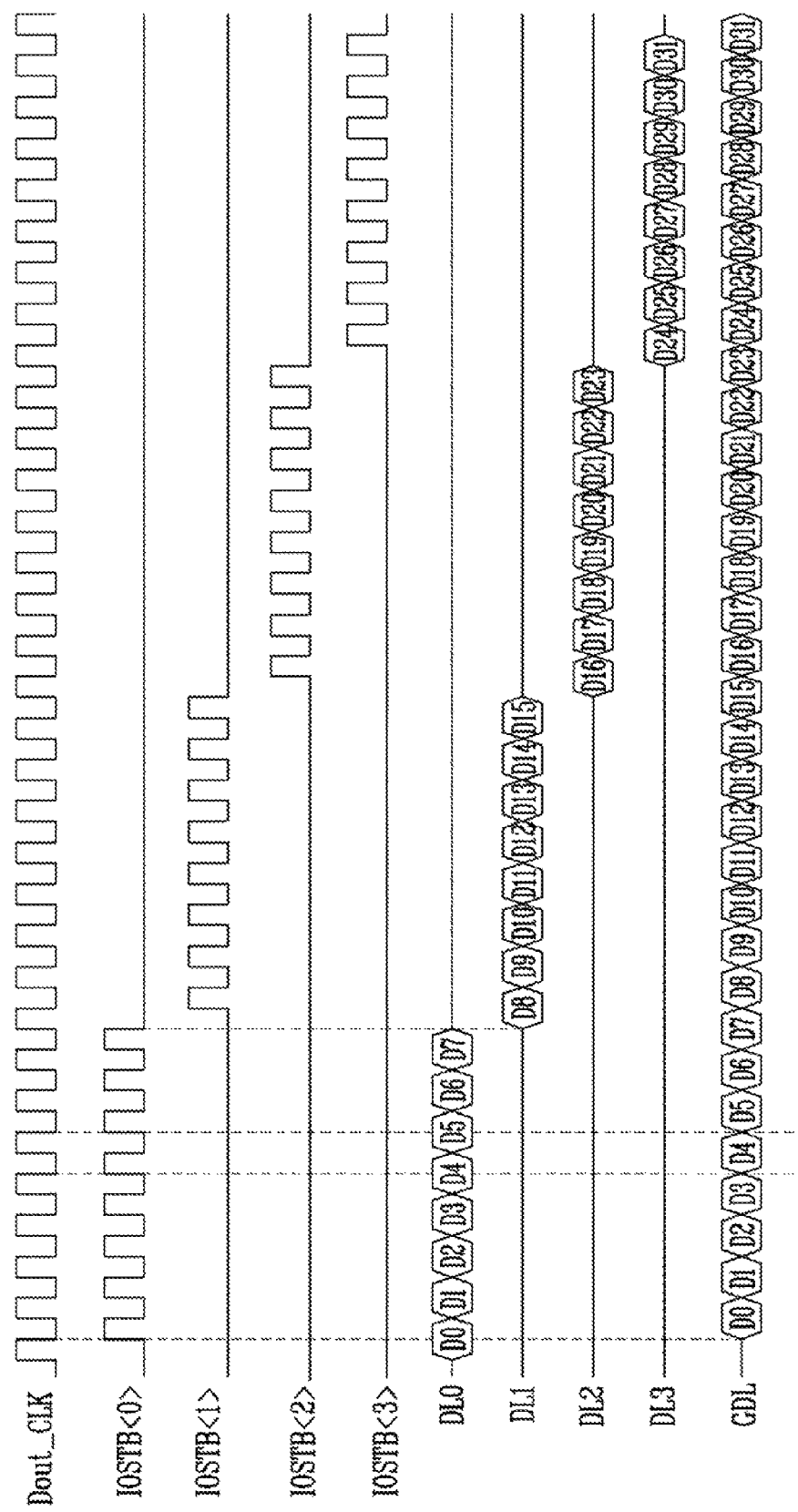
FIG. 4 is a flowchart illustrating a method of sequentially performing data output operations of page buffer groups during a data output operation of a semiconductor memory device according to an embodiment.

FIG. 4 is a flowchart illustrating a method of sequentially performing data output operations of page buffer groups during a data output operation of a semiconductor memory device according to an embodiment.

Referring to FIGS. 1 to 4, a method of sequentially performing data output operations of a plurality of page buffer groups is described below.

When the command signal CMD associated with a read operation and a data output operation is inputted from an external device, the control logic 120 may perform the read operation by controlling the voltage supply 130 and the page buffer circuit 140 in response to the command signal CMD and the address signal ADD. More specifically, the voltage supply 130 may generate a read voltage and apply the read voltage to a selected word line, among a plurality of word lines WL. The main page buffer unit 141 of the page buffer circuit 140 may sense potential levels of the bit lines BL coupled to selected memory cells.

During a data read operation, data output operations of the main page buffer groups PBG0 to PBG3 included in the main page buffer unit 141 may be sequentially performed. In other words, the column selection signal and strobe signal generation unit 121 may generate column selection signals corresponding to and in order of the main page buffer groups PBG0 to PBG3. In addition, the column selection signal and strobe signal generation unit 121 may sequentially generate column selection signals CS<n:0> corresponding to one main page buffer group (e.g., PBG0). The column selection signals CS<n:0> may be synchronized to the data output clock Dout_CLK.

The main page buffer groups PBG0 to PBG3 included in the main page buffer unit 141 of the page buffer circuit 140 may sequentially output read data to the corresponding main data lines DL0 to DL3 in response to the column selection signals CS<n:0>.

In addition, the column selection signal and strobe signal generation unit 121 may sequentially generate the strobe signals IOSTB<3:0> to control operations of the sense amplifier circuit 150. Each of the strobe signals IOSTB<3:0> may continuously toggle a predetermine number of times. For example, the strobe signal IOSTB<0> may be inputted to the sense amplifier 151, continuously toggling n times (e.g., 8 times). Thus, the sense amplifier 151 may sequentially sense read data D0 to D7 sequentially transferred to the main data line DL0 and transfer the sensed read data D0 to D7 to the global data line GDL. Subsequently, the strobe signal IOSTB<1> may be inputted to the next sense amplifier, continuously toggling times (e.g., 8 times). The next sense amplifier may sequentially sense read data D8 to D15 sequentially transferred to the main data line DL2, and transfer the sensed read data D8 to D15 to the global data line GDL.

According to the above-described method, the read data D0 to D31 transferred to the main data lines DL0 to DL3 may be sensed and transferred to the global data line GDL, so that the data output operation may be performed.

By the above-described method, the read data transferred to the main data lines DL0 to DL3 from the respective main page buffer groups PBG0 to PBG3 may be sequentially sensed for each of the main data lines DL0 to DL3 and be transferred to the global data line. However, according to this method, it may not allow each sense amplifier enough time to sense single data. As a result, an error may occur during a data sensing operation. Loads of a main data line and junction capacitances of transistors coupled to the main data line may cause a lack of precharge time and discharge time of the main data line. Therefore, an error may occur during a data sensing operation.

Figure 5:
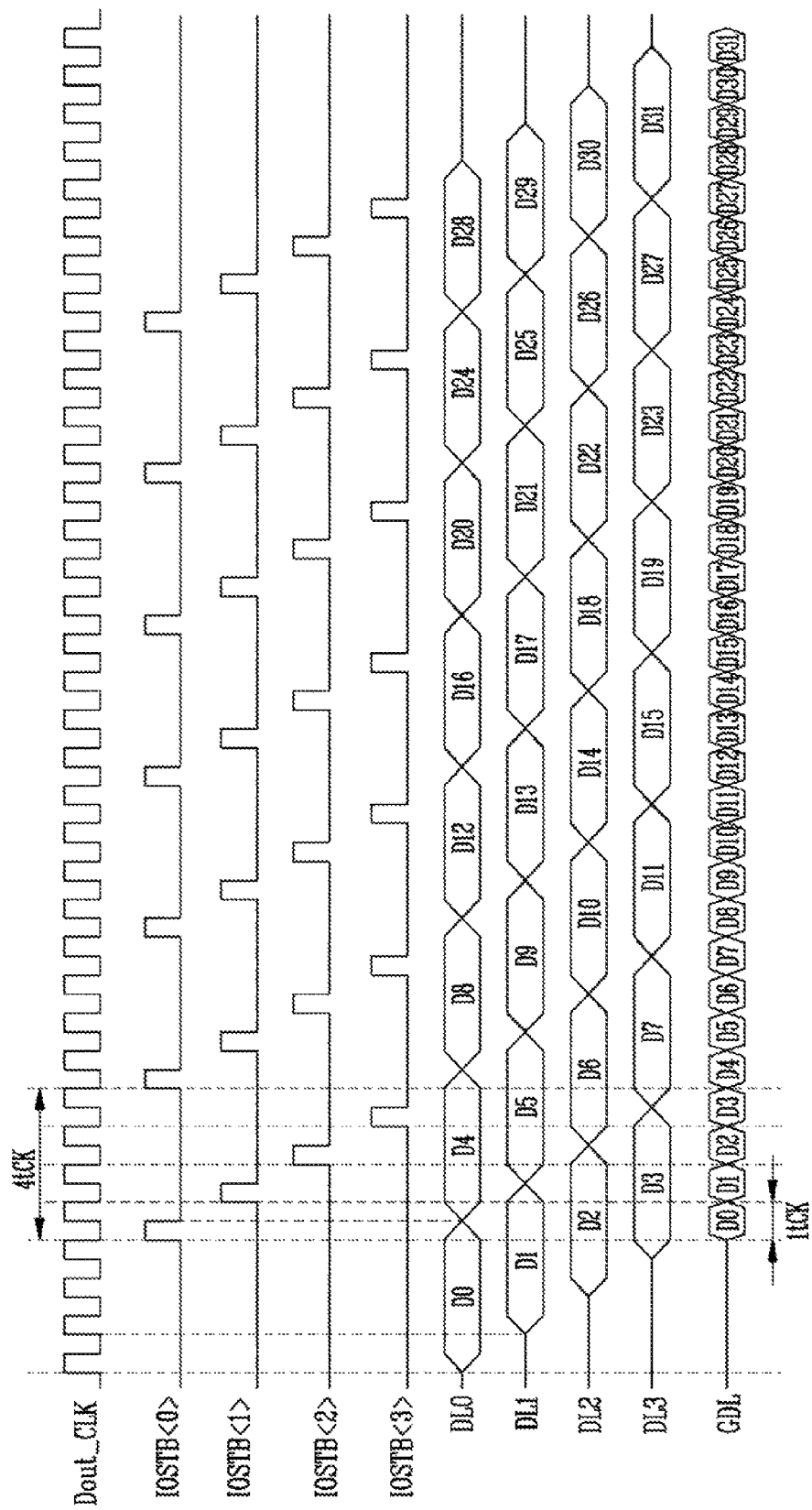
FIG. 5 is a flowchart illustrating a method of performing data output operations of page buffer groups in parallel during a data output operation of a semiconductor memory device according to an embodiment.

FIG. 5 is a flowchart illustrating a method of performing data output operations of page buffer groups in parallel during a data output operation of a semiconductor memory device according to an embodiment.

A method of performing data output operations of page buffer groups in parallel to overlap each other is described below with reference to FIGS. 1, 3, and 5.

When the command signal CMD associated with a read operation and a data output operation is inputted from an external device, the control logic 120 may control the voltage supply 130 and the page buffer circuit 140 in response to the command signal CMD and the address signal ADD to thereby perform the read operation. More specifically, the voltage supply 130 may generate a read voltage and apply the read voltage to a selected word line, among the word lines WL. The main page buffer unit 141 of the page buffer circuit 140 may sense potential levels of the bit lines BL coupled to selected memory cells and temporarily store read data.

During a data read operation, data output operations of the main page buffer groups PBG0 to PBG3 included in the main page buffer unit 141 may be performed in parallel. In other words, the column selection signal and strobe signal generation unit 121 may alternately generate column selection signals corresponding to the main page buffer groups PBG0 to PBG3. For example, the column selection signal and strobe signal generation unit 121 may generate the column selection signal CS<0> corresponding to the main page buffer group PBG0, the column selection signal CS<0> corresponding to the main page buffer group PBG1, the column selection signal CS<0> corresponding to the main page buffer group PBG2, and the column selection signal CS<0> corresponding to the main page buffer group PBG3. Subsequently, the column selection signal and strobe signal generation unit 121 may generate the column selection signal CS<1> corresponding to the page buffer group PBG0, so as to alternately generate column selection signals corresponding to the main page buffer groups PBG0 to PBG3. The column selection signals CS<n:0> may be synchronized to the data output clock Dout_CLK.

Thus, the main page buffer groups PBG0 to PBG3 included in the main page buffer unit 141 of the page buffer circuit 140 may sequentially output read data D0 to D31 to the corresponding main data lines DL0 to DL3 in response to the column selection signals CS<n:0>. In addition, when one main page buffer group outputs data to the corresponding main data line, sufficient time may be ensured between successive data output operations, so that stability of the data output operation may be improved.

The column selection signal and strobe signal generation unit 121 may sequentially generate the strobe signals IOSTB<3:0> to control operations of the sense amplifier circuit 150. The strobe signals IOSTB<3:0> may not continuously toggle as in the previous method, but may toggle once at a predetermined cycle. For example, after the strobe signal IOSTB<0> may toggle once, the strobe signal IOSTB<1> may toggle once. Subsequently, the strobe signal IOSTB<2> may toggle once, and finally the strobe signal IOSTB<3> may toggle once. Subsequently, the strobe signal IOSTB<0> may start to toggle again. Each of the strobe signals IOSTB<3:0> may be set to toggle once at the cycle of predetermined clocks 4$t$CK. Thus, the plurality of sense amplifiers 151 and 152 may sequentially sense potentials of the main data lines DL0 to DL3, output the sensed data D0 to D31 to the global data line GDL, and sequentially sense potentials of the main data lines DL0 to DL3 again. The data D0 to D31 may be outputted to the global data line GDL at a shorter cycle 1$t$CK than the predetermined cycle 4$t$CK of each of the strobe signals IOSTB<3:0> by the sequential output operations of the four sense amplifiers 151 and 152.

Therefore, a time margin 4$t$CK may be ensured between one data sensing operation performed by one sense amplifier and the next data sensing operation, so that a sensing operation margin may be improved.

As described above, when the sense amplifiers may sense read data transferred to the main data lines DL0 to DL3 and transfer the read data to the global data line GDL, data sensing operations of the sense amplifiers may be performed in parallel to improve sensing operation margin.

Figure 6:
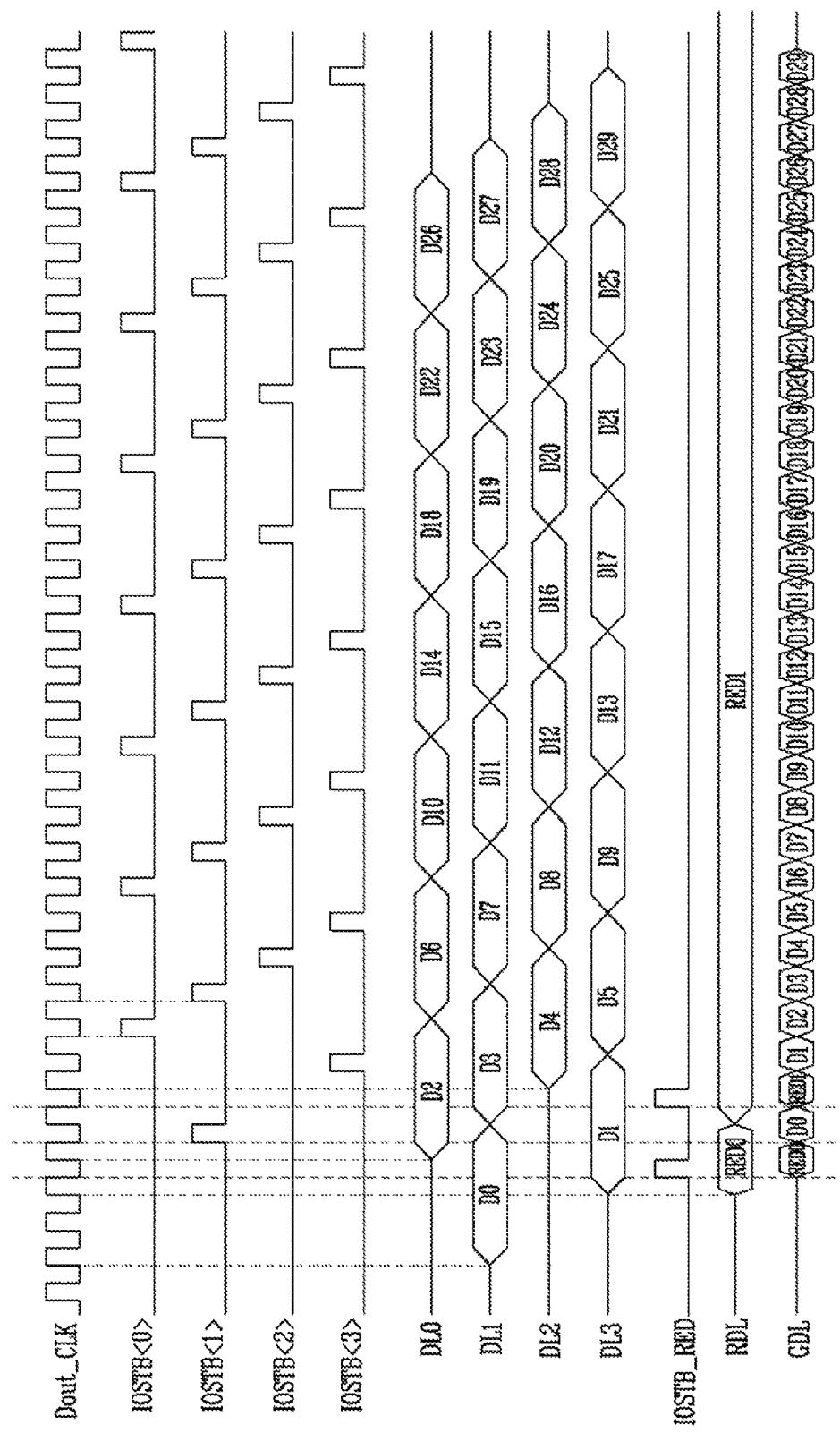
FIG. 6 is a flowchart illustrating a method of performing data output operations of page buffer groups in parallel and at the same time, and performing a redundancy data output operation, during a data output operation of a semiconductor memory device according to an embodiment.

FIG. 6 is a flowchart illustrating a method of performing data output operations of page buffer groups in parallel and at the same time and performing a redundancy data output operation, during a data output operation of a semiconductor memory device according to an embodiment.

According to an embodiment, an operation of replacing first read data and third read data by redundancy data is described.

When the command signal CMD associated with a read operation and a data output operation is inputted from an external device, the control logic 120 may control the voltage supply 130 and the page buffer circuit 140 to perform the read operation in response to the command signal CMD and the address signal ADD. More specifically, the voltage supply 130 may generate a read voltage and apply the read voltage to a selected word line, among the word lines WL. The main page buffer unit 141 of the page buffer circuit 140 may sense potential levels of the bit lines BL coupled to selected memory cells and temporarily store read data.

In addition, the redundancy page buffer unit 142 of the page buffer circuit 140 may sense the potential levels of the bit lines BL coupled to the selected memory cells and temporarily store redundancy data.

During a data read operation, data output operations of the main page buffer groups PBG0 to PBG3 included in the main page buffer unit 141 may be performed in parallel. In other words, the column selection signal and strobe signal generation unit 121 may alternately generate column selection signals corresponding to the main page buffer groups PBG0 to PBG3. For example, the column selection signal and strobe signal generation unit 121 may generate the column selection signal CS<0> corresponding to the main page buffer group PBG0, the column selection signal CS<0> corresponding to the main page buffer group PBG1, the column selection signal CS<0> corresponding to the main page buffer group PBG2, and finally the column selection signal CS<0> corresponding to the main page buffer group PBG3. Since the first data and the third data are replaced by redundancy data, the first column selection signal CS<0> of the main page buffer group PBG0 and the first column selection signal CS<0> of the main page buffer group PBG2 may not be activated.

Subsequently, the column selection signal and strobe signal generation unit 121 may generate the column selection signal CS<1> corresponding to the page buffer group PBG0, so as to alternately generate column selection signals corresponding to the main page buffer groups PBG0 to PBG3. The column selection signals CS<n:0> may be synchronized to the data output clock Dout_CLK.

Therefore, the main page buffer groups PBG0 to PBG3 included in the main page buffer unit 141 of the page buffer circuit 140 may sequentially output the read data D0 to D29 to the main data lines DL0 to DL3 in response to the column selection signals CS<n:0>. In addition, when one main page buffer group outputs data to the corresponding main data line, sufficient time may be ensured between successive data output operations, so that stability of the data output operation may be improved.

In addition, the column selection signal and strobe signal generation unit 121 may sequentially generate a column selection signal applied to a redundancy page buffer group RPBG. A column selection signal applied to the redundancy page buffer group RPBG may be generated at a shorter period than the column selection signals applied to the main page buffer groups PBG0 to PBG3. A data output operation of one redundancy page buffer group may be performed at a higher speed than data output operations of the main page buffer groups PBG0 to PBG3 so that the redundancy page buffer group may output a plurality of redundancy data to replace read data.

Therefore, the redundancy page buffer group RPBG included in the redundancy page buffer unit 142 of the page buffer circuit 140 may sequentially output redundancy data RED0 and RED1 to the redundancy data line RDL in response to the column selection signals.

The column selection signal and strobe signal generation unit 121 may generate the strobe signals IOSTB<3:0> and IOSTB_RED to control operations of the sense amplifier circuit 150. Each of the strobe signals IOSTB<3:0> may toggle once at a predetermined cycle and may be alternately generated. For example, after the strobe signal IOSTB<0> toggles once, the strobe signal IOSTB<1> may toggle once. Subsequently, the strobe signal IOSTB<2> may toggle once, and finally the strobe signal IOSTB<3> may toggle once. Then, the strobe signal IOSTB<0> may start to toggle again. Since first data and third data are replaced by redundancy data, the first clock of the strobe signal IOSTB<0> and the first clock of the strobe signal IOSTB<2> may not toggle. Instead, the strobe signal IOSTB_RED may toggle twice, and the sense amplifier 153 may sense the redundancy data RED0 and RED1 by sensing a potential of the redundancy data line RDL. Each of the strobe signals IOSTB<3:0> may toggle once at a predetermined cycle. In addition, the strobe signal IOSTB_RED may toggle at a shorter period than the strobe signals IOSTB<3:0> to output a plurality of redundancy data. Thus, the plurality of sense amplifiers 151, 152 and 153 may sequentially sense potentials of the main data lines DL0 to DL3 and the redundancy data line RDL to output the sensed data RED0, D0, RED1, and D1 to D29 to the global data line GDL.

The column selection signal and strobe signal generation unit 121 may generate the column selection signals and the strobe signals. The column selection signals to be applied to the main page buffer unit 141 and the strobe signal to be applied to the sense amplifiers 151 and 152 corresponding to the main page buffer unit 141 may have a first period. The column selection signals to be applied to the redundancy page buffer unit 142 and the strobe signal to be applied to the sense amplifier 153, corresponding to the redundancy page buffer unit 142, may have a shorter second period than the first period. Therefore, a sensing operation interval of the sense amplifier 153 coupled to the redundancy data line RDL may be shorter than a sensing operation interval of the sense amplifiers 151 and coupled to the main data lines DL0 to DL3.

As described above, the sense amplifiers may sense read data and redundancy data transferred to the main data lines DL0 to DL3 and the redundancy data line RDL and transfer the read data and the redundancy data to the global data line GDL. The sense amplifier that senses the redundancy data may have a shorter sensing operation than the other sense amplifiers to thereby sense a plurality of redundancy data.

Figure 7:
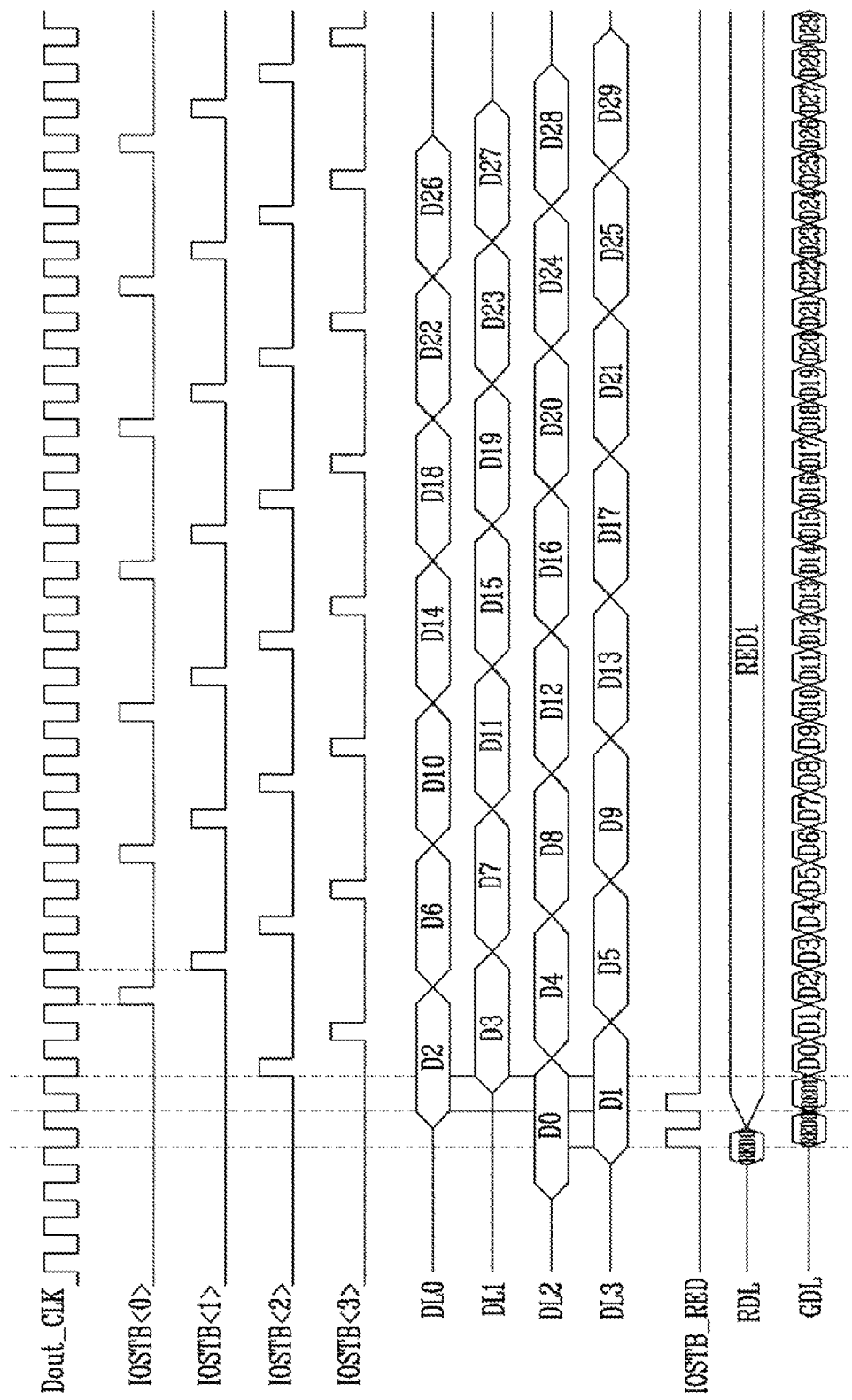
FIG. 7 is a flowchart illustrating a method of performing data output operations of page buffer groups in parallel and at the same time, performing successive redundancy data output operations, during a data output operation of a semiconductor memory device according to an embodiment.

FIG. 7 is a flowchart illustrating a method of performing overlapping data output operations of page buffer groups and performing successive redundancy data output operations, during a data output operation of a semiconductor memory device according to an embodiment.

According to an embodiment, an operation in which first read data and second read data are consecutively replaced by redundancy data is described.

When the command signal CMD associated with a read operation and a data output operation is inputted from an external device, the control logic 120 may control the voltage supply 130 and the page buffer circuit 140 to perform a read operation in response to the command signal CMD and the address signal ADD. More specifically, the voltage supply 130 may generate a read voltage and apply the read voltage to a selected word line, among the plurality of word lines WL. The main page buffer unit 141 of the page buffer circuit 140 may sense potential levels of the bit lines BL coupled to selected memory cells and temporarily store read data.

In addition, the redundancy page buffer unit 142 of the page buffer circuit 140 may sense potential levels of the bit lines BL coupled to the selected memory cells and temporarily store redundancy data.

During a data read operation, data output operations of the main plurality of page buffer groups PBG0 to PBG3 included in the main page buffer unit 141 may be performed in parallel. In other words, the column selection signal and strobe signal generation unit 121 may alternately generate column selection signals corresponding to the main page buffer groups PBG0 to PBG3. For example, the column selection signal and strobe signal generation unit 121 may generate the column selection signal CS<0> corresponding to the main page buffer group PBG0, the column selection signal CS<0> corresponding to the main page buffer group PBG1, the column selection signal CS<0> corresponding to the main page buffer group PBG2, and the column selection signal CS<0> corresponding to the main page buffer group PBG3. Since first data and second data are replaced by redundancy data, the first column selection signal CS<0> of the main page buffer group PBG0 and the first column selection signal CS<0> of the main page buffer group PBG1 may not be activated.

Subsequently, the column selection signal and strobe signal generation unit 121 generate the column selection signal CS<1> corresponding to the page buffer group PBG0, so as to alternately generate the column selection signals corresponding to the page buffer groups PBG0 to PBG3. The column selection signals CS<n:0> may be synchronized to the data output clock Dout_CLK.

The plurality of main page buffer groups PBG0 to PBG3 included in the main page buffer unit 141 of the page buffer circuit 140 may sequentially output read data D0 to D29 to the main data lines DL0 to DL3 in response to the column selection signals CS<n:0>. In addition, when one main page buffer group outputs data to a corresponding data line, sufficient time may be ensured between successive data output operations, so that reliability of a data output operation may be improved.

In addition, the column selection signal and strobe signal generation unit 121 may sequentially generate and input a column selection signal to be applied to the redundancy page buffer group RPBG. The column selection signal applied to the redundancy page buffer group RPBG may be generated at a shorter cycle than the column selection signals applied to the page buffer groups PBG0 to PBG3. A data output operation of one redundancy page buffer group may be performed at a higher speed than data output operations of the main page buffer groups PBG0 to PBG3 so that the redundancy page buffer group may output a plurality of redundancy data to replace read data.

Therefore, the redundancy page buffer group RPBG included in the redundancy page buffer unit 142 of the page buffer circuit 140 may sequentially output the redundancy data RED0 and RED1 to the redundancy data line RDL in response to the column selection signals.

The column selection signal and strobe signal generation unit 121 may generate the strobe signals IOSTB<3:0> and IOSTB_RED to control operations of the sense amplifier circuit 150. Each of the strobe signals IOSTB<3:0> may toggle once at a predetermined cycle and be alternately generated. For example, the strobe signal IOSTB<0> may toggle once, and the strobe signal IOSTB<1> may toggle once. The strobe signal IOSTB<2> may toggle once, and finally the strobe signal IOSTB<3> may toggle once. Subsequently, the strobe signal IOSTB<0> starts to toggle again. Since first data and second data are replaced by redundancy data, a first clock of the strobe signal IOSTB<0> and a first clock of the strobe signal IOSTB<1> may not toggle. Instead, the strobe signal IOSTB_RED may continuously toggle twice, and the sense amplifier 153 may sense the redundancy data RED0 and RED1 by sensing a potential of the redundancy data line RDL.

Each of the strobe signals IOSTB<3:0> may be set to toggle once at a predetermined cycle. In addition, the strobe signal IOSTB_RED may toggle at a shorter cycle than the strobe signals IOSTB<3:0> to output a plurality of redundancy data. The strobe signal IOSTB_RED may toggle twice before a first clock of the strobe signal IOSTB<2> toggles, so that the sense amplifier 153 may sense the consecutive redundancy data RED0 and RED1.

The column selection signal and strobe signal generation unit 121 may generate the column selection signals and the strobe signals. The column selections signals applied to the main page buffer unit 141 and the strobe signal applied to the sense amplifiers 151 and 152 corresponding to the main page buffer unit 141 may have a first period. The column selection signals applied to the redundancy page buffer unit 142 and the strobe signal applied to the sense amplifier 153 corresponding to the redundancy page buffer unit 142 may have a third period, which shorter than the first period. The third period may also be shorter than the second period described with reference to FIG. 6.

Thus, the sense amplifiers 151, 152 and 153 may perform, in parallel, the operations of sensing potentials of the main data lines DL0 to DL3 and the redundancy data line RDL coupled thereto and output the data RED0, RED1, and D0 to D29 to the global data line GDL.

As described above, the sense amplifiers may sense read data and redundancy data transferred to the main data lines DL0 to DL3 and the redundancy data line RDL and transfer the read data and the redundancy data to the global data line GDL. However, since the sense amplifier sensing the redundancy data may have a shorter sensing operation interval than the other sense amplifiers, the sense amplifier may sense a plurality of redundancy data. In addition, successive redundancy data output operations may be performed by further reducing a toggle cycle of the strobe signal IOSTB_RED.

Figure 8:
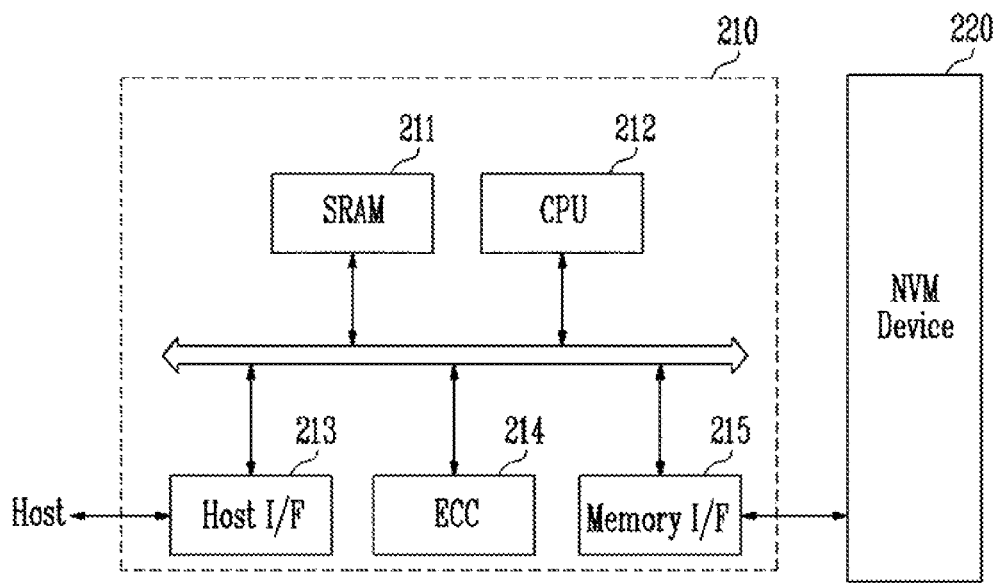
FIG. 8 is a block diagram illustrating a memory system according to an embodiment.

FIG. 8 is a bock diagram illustrating a memory system according to an embodiment of the present invention.

Referring to FIG. 8, the memory system 200 may include a non-volatile memory device 220 and a memory controller 210.

The non-volatile memory device 220 may be configured as the above-described semiconductor memory device and may be operated by the above-described method for compatibility with the memory controller 210. The memory controller 210 may be configured to control the non-volatile memory device 220. The memory system 200 having the above-described configuration may be a memory card or a solid-state disk (SSD) in which the non-volatile memory device 220 and the memory controller 210 are combined. A static RAM (SRAM) 211 may function as an operation memory of a central process unit (CPU) 212. A host interface (I/F) 213 may include a data exchange protocol of a host being coupled to the memory system 200. An error correction code (ECC) 214 may detect and correct errors included in a data read from the non-volatile memory device 220. A memory interface (I/F) 215 may interface with the non-volatile memory device 220. The CPU 212 may perform the general control operation for data exchange of the memory controller 210.

Though not illustrated in FIG. 8, the memory system 200 may further include ROM (not illustrated) that stores code data to interface with the host. Furthermore, the non-volatile memory device 220 may be a multi-chip package composed of a plurality of flash memory chips. The memory system 200 may be provided as a storage medium having high reliability and low error rates. The flash memory according to an embodiment of the present invention may be provided in a memory system such as a semiconductor disk device, for example, a solid-state disk (SSD). When the memory system 200 is an SSD, the memory controller 110 may communicate with the outside, e.g., a host, through one of the interface protocols including USB, MMC, PCI-E, SATA, PATA, SCSI, ESDI and IDE.

Figure 9:
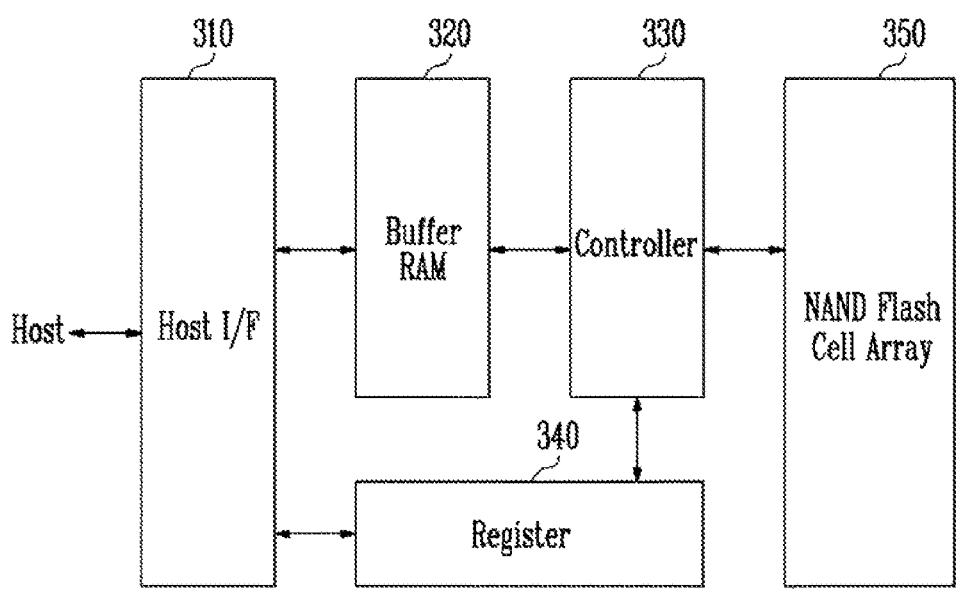
FIG. 9 is a block diagram illustrating a fusion memory device or a fusion memory system performing a program operation according to the earlier described various embodiments.

FIG. 9 is a block diagram illustrating a fusion memory device or a fusion memory system according to the aforementioned various embodiments. For example, technical features of the present invention may be applied to a OneNand flash memory 300 as the fusion memory device.

The OneNand flash memory 300 may include a host interface (I/F) 310, a buffer RAM 320, a controller 330, a register 340 and a NAND flash cell array 350. The host interface 310 may be configured to exchange various types of information with a device even using a different protocol. The buffer RAM 320 may have built-in codes for driving the flash memory 300 or temporarily storing data. The controller 330 may be configured to control read and program operations, and every state based on a control signal and a command that are externally given. The register 340 may be configured to store data including instructions, addresses and configurations defining a system operating environment in the flash memory 300. The NAND flash cell array 350 may include operating circuits including non-volatile memory cells and page buffers. Based on a write request from a host, the OneNAND flash memory 300 may program data in the aforementioned manner.

Figure 10:
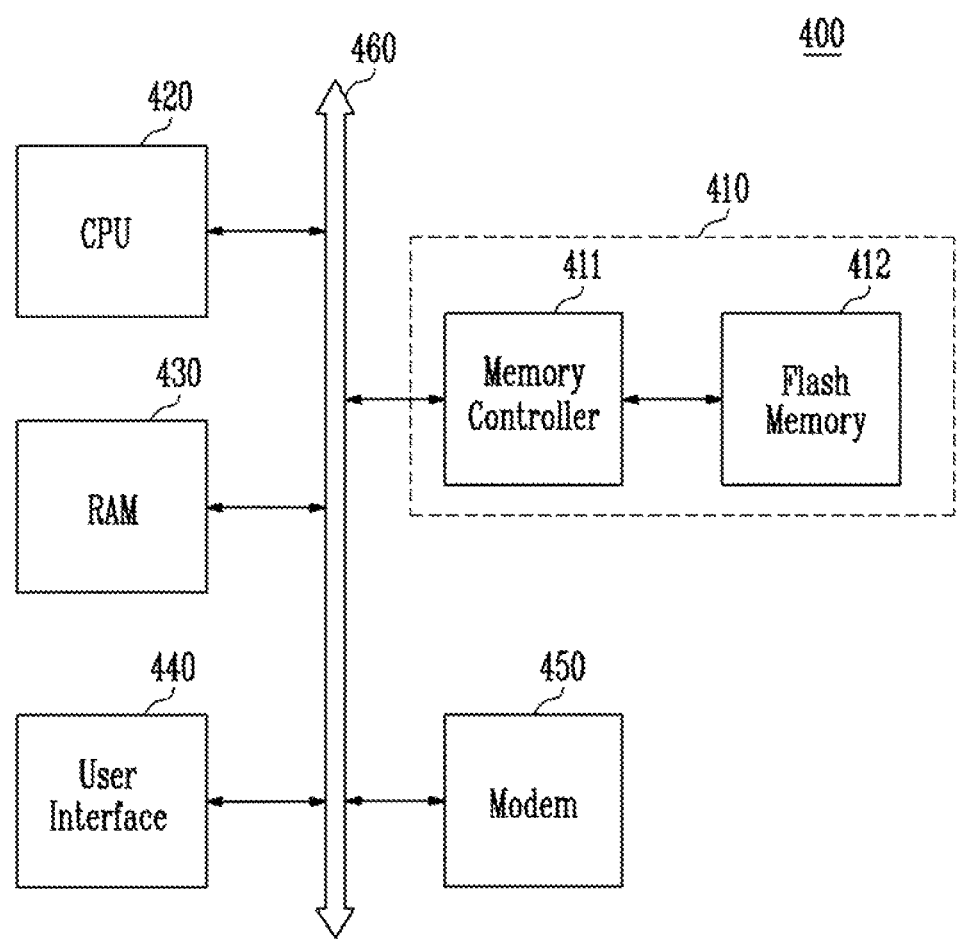
FIG. 10 is a block diagram illustrating a flash memory device according to an embodiment.

FIG. 10 is a block diagram of a computing system according to an embodiment of the present invention.

The computing system 400 may include a CPU 420, a RAM 430, a user interface 440, a modem 450, such as a baseband chipset, and a memory system 410 that are electrically coupled to a system bus 460. If the computing system 400 is a mobile device, a battery may be provided to apply operating voltages to the computing system 400. The memory system 410 may include a memory controller 411 and a flash memory 412. Though not shown in FIG. 10, the computing system 400 may further include an application chipset, a camera image processor, or a mobile DRAM. The memory system 410 may form a solid-state drive (SSD) that uses a non-volatile memory to store data. The memory system 410 may be provided as a fusion memory device, e.g., a OneNAND flash memory.

According to an embodiment of the present invention, when a data output operation of a semiconductor memory device is performed by dividing a plurality of page buffers into a plurality of groups, data output operations of the page buffer groups may be performed in parallel, so that a margin of the data output operation of each group may be improved.

In addition, a cycle of a data output operation of a redundancy page buffer group may be set to be shorter than a cycle of a data output operation of a main page buffer group, so that a stabilized redundancy operation may be performed.

Various embodiments described above are not limited to a device and a method but may be implemented through program implementing functions corresponding to the features of embodiments or a non-transitory, computer-readable recording medium where the program is recorded. Such implementation is easily done by a person of ordinary skill in the art based on the description of the embodiments.

Although embodiments have been described with reference to a number of illustrative embodiments thereof, it should be understood that numerous other modifications and various embodiments can be devised by those skilled in the art that will fall within the spirit and scope of the claimed invention as set forth in the following claims.

What is claimed is:

1. A semiconductor memory device, comprising:
   a main sense amplifier circuit suitable for sensing first potentials of main data lines coupled to a main cell region and outputting the first potentials to a global data line in response to first strobe signals having a first period; and
   a redundancy sense amplifier circuit suitable for sensing a second potential of a redundancy data line coupled to a redundancy cell region and outputting the second potential to the global data line in response to second strobe signals having a second period,
   wherein the second period is shorter than the first period.

2. The semiconductor memory device of claim 1, wherein:
   the main cell region includes a main memory unit and a plurality of main page buffer groups corresponding thereto; and
   the plurality of main page buffer groups correspond to the main data lines, respectively, and output data read from the main memory unit to the main data lines in response to first column selection signals.

3. The semiconductor memory device of claim 2, wherein:
   the redundancy memory area includes a redundancy memory unit and a redundancy page buffer group corresponding thereto;
   the redundancy page buffer group is coupled to the redundancy data line and outputs data read from the redundancy memory unit to the redundancy data line in response to second column selection signals; and
   the first column selection signals have the first period, and the second column selection signals have the second period.

4. The semiconductor memory device of claim 3, further comprising:
   a column selection signal and strobe signal generation unit suitable for generating the first and second strobe signals and the first and second column selection signals.

5. The semiconductor memory device of claim 4, wherein the column selection signal and strobe signal generation unit controls a data output operation time of each of the redundancy page buffer group and the redundancy sense amplifier circuit by controlling periods of the second strobe signals and the second column selection signals.

6. A semiconductor memory device, comprising:
   a memory block including a main memory area and a redundancy memory area;
   main data lines and a redundancy data line corresponding to the main memory area and the redundancy memory area, respectively;
   a strobe signal generation unit suitable for outputting first strobe signals having a first period and a second strobe signal having a second period; and
   a sense amplifier circuit suitable for sensing potential levels of the main data lines and the redundancy data line and outputting sensed read data to a global data line in response to the first and second strobe signals.

7. The semiconductor memory device of claim 6, wherein the second period is shorter than the first period.

8. The semiconductor memory device of claim 6, wherein:
   the main memory area includes a main memory unit and a plurality of main page buffer groups corresponding thereto; and
   the plurality of main page buffer groups correspond to the main data lines, respectively, and output data read from the main memory unit to the main data lines in response to first column selection signals.

9. The semiconductor memory device of claim 8, wherein:
   the redundancy memory area includes a redundancy memory unit and a redundancy page buffer group corresponding thereto;
   the redundancy page buffer group is coupled to the redundancy data line and outputs data read from the redundancy memory unit to the redundancy data line in response to second column selection signals; and
   the first column selection signals have the first period, and the second column selection signals have the second period.

10. The semiconductor memory device of claim 6, wherein the sense amplifier circuit comprises:
    a plurality of first sense amplifiers coupled to the main data lines, respectively; and
    a second sense amplifier coupled to the redundancy data line,
    wherein the plurality of first sense amplifiers perform sensing operations in parallel to sense potentials of the main data lines in response to the first strobe signals, respectively.

11. The semiconductor memory device of claim 10, wherein each period of the sensing operations of the first sense amplifiers is shorter than a period of a sensing operation of the second sense amplifier.

12. A semiconductor memory device, comprising:
    a memory cell part including a main memory unit and a redundancy memory unit;
    a page buffer circuit including a plurality of page buffer groups and suitable for reading data stored in the memory cell part to temporarily store read data; and
    a sensing circuit including a plurality of sense amplifiers corresponding to the plurality of page buffer groups, respectively, and suitable for sensing the read data in response to strobe signals,
    wherein the plurality of sense amplifiers perform data sensing operations in parallel in order to sense the read data.

13. The semiconductor memory device of claim 12, wherein:
    the page buffer groups output the read data to a plurality of data lines in response to column selection signals, respectively; and
    the sense amplifiers sense the read data outputted to the plurality of data lines in response to the strobe signals, respectively.

14. The semiconductor memory device of claim 13, further comprising:
    a column selection signal and strobe signal generation unit suitable for generating the column selection signals and the strobe signals.

15. The semiconductor memory device of claim 14, wherein the column selection signal and strobe signal generation unit sequentially generates the column selection signals for each page buffer group, or alternately generates the column selection signals for the respective page buffer groups.

16. The semiconductor memory device of claim 14, wherein the column selection signal and strobe signal generation unit sequentially generates the strobe signals for each sense amplifier, or alternately generates the strobe signals for the respective sense amplifiers.

17. The semiconductor memory device of claim 16, wherein;
when the column selection signal and strobe signal generation unit sequentially generates the strobe signals, each of the strobe signals continuously toggles for an amount of data that is continuously transferred to a corresponding data line; and
when the column selection signal and strobe signal generation unit alternately generates the strobe signals, the strobe signals applied to the respective sense amplifiers alternately toggle once.

18. The semiconductor memory device of claim 13, wherein:
the page buffer groups include a redundancy page buffer group corresponding to the redundancy memory unit; and
the sense amplifiers include a redundancy sense amplifier coupled to the redundancy page buffer group through one of the data lines.

19. The semiconductor memory device of claim 18, wherein:
the page buffer groups include main page buffer groups corresponding to the main memory unit and the sense amplifiers include main sense amplifiers coupled to the main page buffer groups;
column selection signals applied to the main page buffer groups have a first period, and column selection signals applied to the redundancy page buffer group have a second period; and
strobe signals applied to the main sense amplifiers have the first period, and a strobe signal applied to the redundancy sense amplifier has the second period.

20. The semiconductor memory device of claim 19, wherein the second period is shorter than the first period.

* * * * *